United States Patent
Manda et al.

(10) Patent No.: US 8,212,296 B2
(45) Date of Patent: Jul. 3, 2012

(54) SEMICONDUCTOR DEVICE AND A METHOD OF MANUFACTURING THE SAME, AND SOLID-STATE IMAGE PICKUP ELEMENT

(75) Inventors: Shuji Manda, Kumamoto (JP); Hiroshi Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 248 days.

(21) Appl. No.: 12/778,308

(22) Filed: May 12, 2010

(65) Prior Publication Data

US 2010/0308385 A1 Dec. 9, 2010

(30) Foreign Application Priority Data

Jun. 3, 2009 (JP) ................................. 2009-134424

(51) Int. Cl.
*H01L 31/062* (2012.01)
(52) U.S. Cl. ......... 257/292; 257/E27.133; 257/E21.643; 438/209
(58) Field of Classification Search .................. 257/292, 257/E27.133, E21.643; 438/209
See application file for complete search history.

(56) References Cited

U.S. PATENT DOCUMENTS 7,235,826 B2 * 6/2007 Ezaki et al. .................... 257/225
2009/0014789 A1 * 1/2009 Manabe ......................... 257/334

FOREIGN PATENT DOCUMENTS

JP 2005-223084 8/2005

* cited by examiner

*Primary Examiner* — Ha Tran T Nguyen
*Assistant Examiner* — Shaun Campbell
(74) *Attorney, Agent, or Firm* — SNR Denton US LLP

(57) ABSTRACT

Disclosed herein is a semiconductor device having a vertical MOS transistor having a channel of a first conductivity type and formed by burying a gate electrode in a semiconductor substrate, a planar MOS transistor having a channel of the first conductivity and having a gate electrode formed on the semiconductor substrate, and a planar MOS transistor having a channel of a second conductivity and having a gate electrode formed on the semiconductor substrate, the semiconductor device, including other circuit element(s), other than a transistor, formed either below or above the vertical MOS transistor having the channel of the first conductivity type.

15 Claims, 7 Drawing Sheets

US 8,212,296 B2

SEMICONDUCTOR DEVICE AND A METHOD OF MANUFACTURING THE SAME, AND SOLID-STATE IMAGE PICKUP ELEMENT

BACKGROUND OF THE INVENTION

1. Field of the Invention

The present invention relates to a semiconductor device including a vertical metal oxide semiconductor (MOS) transistor having a gate electrode and a gate insulating film which are buried in a semiconductor substrate, and a method of manufacturing the same. In addition, the present invention relates to a solid-state image pickup element including a vertical MOS transistor in a pixel portion.

2. Description of the Related Art

In a solid-state image pickup element, a high integration level for circuits is promoted for enhancement of a sensitivity, and thus there are proposed various kinds of techniques for ensuring an area of a photodiode.

For example, a structure is proposed in which a trench is formed on a photodiode formed on a back surface side of a silicon substrate, and a transfer gate is provided inside the trench, thereby forming a vertical MOS transistor in the trench. This technique, for example, is described in Japanese Patent Laid-Open No. 2005-223084.

In the vertical MOS transistor formed in the trench, an electrode material of a gate electrode is buried in the trench which is covered with a gate insulating film. Thus, a sidewall portion and a bottom surface portion of the trench compose a channel portion.

With this structure, the sensitivity can be enhanced because an area of a photodiode can be increased as compared with the case of a structure in which a photodiode and a transfer gate are formed individually on a front surface side of the silicon substrate.

SUMMARY OF THE INVENTION

The solid-state image pickup element having the vertical MOS transistor having the gate used as the transfer gate has a structure in which the vertical MOS transistor and MOS transistors (an amplification MOS transistor, a selection MOS transistor and a reset MOS transistor), each structured in the form of a normal planar MOS transistor, in a pixel portion, and MOS transistors in a logic portion are embedded. For this reason, the electrode forming process becomes complicated.

In the manufacture process for the existing solid-state image pickup element composed of only the planer MOS transistors, after a single polycrystalline silicon layer is formed, patterning and ion implantation are carried out by using respective photo masks (each utilizing a photolithography process), thereby forming electrodes of an NMOS portion and electrodes of PMOS portion separately from each other. That is to say, the simple manufacture processes can be adopted in such a manner.

However, in the solid-state image pickup element having the vertical MOS transistor, when an electrode layer of the vertical MOS transistor having a depth of several micron meters buried in the trench is desired to be formed, ions of an impurity introduced into the electrode layer by utilizing the ion implantation process do not diffuse to a bottom of the vertical hole because the trench is deeply formed.

For this reason, the simple manufacture processes described above by which the electrodes of the NMOS portion and the electrodes of the PMOS portion are formed separately from each other by utilizing both the photolithography process and the ion implantation process cannot be applied to the solid-state image pickup element having the vertical MOS transistor.

Then, it is expected that the impurity is introduced into the electrode layer concurrently with the formation of the electrode layer instead of introducing the impurity by utilizing the ion implantation after formation of the electrode layer. The electrode layer of the vertical MOS transistor is formed in such a manner, whereby forming the electrodes of the NMOS portion and the electrodes of the PMOS portion separately from each other becomes possible even in the solid-state image pickup element having the vertical MOS transistor.

A method of manufacturing a solid-state image pickup element having a vertical MOS transistor when an impurity is introduced into an electrode layer concurrently with formation of the electrode layer in such a manner will now be desired with reference to FIGS. 5A to 5H. In this case, there is supposed a columnar vertical MOS transistor which is 1 μm in depth and is 0.2 μm in diameter.

As shown in FIG. 5A, after a vertical hole is formed in a silicon substrate 101, a gate insulating film 102 is formed on the silicon substrate 101. After that, an electrode layer 103 becoming a gate electrode is formed so as to be filled in the vertical hole of the silicon substrate 101. A semiconductor layer containing therein an n-type impurity, for example, a phosphorus-doped amorphous silicon (PDAS) layer is formed as the electrode layer 103.

Next, as shown in FIG. 5B, a photo resist 106 having a pattern corresponding to gate electrodes of a vertical NMOS transistor, and an NMOS transistor in a pixel portion is formed on the electrode layer 103.

Next, as shown in FIG. 5C, the electrode layer 103 is processed with the photo resist 106 as a mask, whereby an n-type gate electrode 103a of the vertical NMOS transistor, and an n-type gate electrode 103b of the NMOS transistor in the pixel portion are respectively formed.

Next, as shown in FIG. 5D, after an oxide film 109 becoming an etching stop film is formed so as to cover the n-type gate electrode 103a and the n-type gate electrode 103b, an electrode layer 107 is formed so as to cover the entire surface of the silicon substrate 101.

Next, as shown in FIGS. 5E and 5F, a photo resist 108 having a pattern corresponding to a gate electrode of the NMOS transistor, and a gate electrode of the PMOS transistor in the logic portion is formed. After that, the electrode layer 107 is processed with the resist 108 as a mask by utilizing both a photolithography process and a dry etching method, whereby a gate electrode 107a of an NMOS transistor in a logic portion, and a gate electrode 107b of a PMOS transistor in the logic portion are both formed.

Next, as shown in FIG. 5G, a photo resist 110 is formed so as to cover the pixel portion including the vertical NMOS transistor, and the NMOS transistor in the logic portion. Also, boron (B) ions are implanted into an unmasked region with the photo resist 110 as a mask, thereby changing the conductivity type of the gate electrode 107b of the PMOS transistor in the logic portion from the n-type to a p-type.

As shown in FIG. 5H, the gate electrodes 103a, 103b, and 107a, 107b of the vertical NMOS transistor and the NMOS transistor in the pixel portion, and the NMOS transistor and the PMOS transistor in the logic portion can be formed in the manner described above.

With the manufacturing method described above, the gate electrode layers of the NMOS transistor, and the gate electrode layer of the PMOS transistor can be formed separately from each other in the vertical NMOS transistor, the pixel NMOS transistor, and the NMOS transistor, the PMOS transistor in the logic portion. Therefore, it is possible to suppress the formation of a depletion layer in each of the gate electrodes of the MOS transistors. As a result, it is possible to obtain the satisfactory electrode characteristics.

However, with the manufacturing method described above, the number of processes increases because the processing and the photolithography process are in heavy usage. For this reason, the productivity is necessarily reduced. In addition, since the number of times of the etching processes increases, the frequency of generation of the residue remaining after completion of the etching process, and the frequency of generation of the divot in a Shallow Trench Isolator (STI) both increase, which results in the reduction of the manufacture yield.

In addition, the vertical MOS transistor can be applied not only to the solid-state image pickup element, but also to other semiconductor devices. For example, it is expected that the vertical MOS transistor is adopted in a semiconductor device including MOS transistors and other circuit elements (such as a resistor, a capacitor and a photodiode), and other circuit elements and the MOS transistors are formed one above the other. As a result, not only the area of the entire semiconductor device can be reduced, but also the area of other circuit elements can be increased.

When even in such a semiconductor device, the gate electrode layers of the NMOS transistor, and the gate electrode layer of the PMOS transistor are formed separately from each other, problems about the productivity and the manufacture yield are caused similarly to the case of the solid-state image pickup element.

The present invention has been made in order to solve the problems described above, and it is therefore desirable to provide a semiconductor device having a structure allowing the semiconductor device to be manufactured with a high productivity and in a high yield and a method of manufacturing the same, and a solid-state image pickup element.

In order to attain the desire described above, according to an embodiment of the present invention, there is provided a semiconductor device having a vertical MOS transistor having a channel of a first conductivity type and formed by burying a gate electrode in a semiconductor substrate, a planar MOS transistor having a channel of the first conductivity and having a gate electrode formed on the semiconductor substrate, and a planar MOS transistor having a channel of a second conductivity and having a gate electrode formed on the semiconductor substrate, the semiconductor device, including:

the vertical MOS transistor having the channel of the first conductivity type, and having the gate electrode having a lamination structure in which an electrode layer containing an impurity of the first conductivity type introduced thereto, and an electrode layer containing no impurity introduced thereto are formed in this order;

the planar MOS transistor having the channel of the first conductivity type, and having the gate electrode having a lamination structure in which an electrode layer containing an impurity of the first conductivity type introduced thereto, and an electrode layer containing no impurity introduced thereto are formed in this order;

the planar MOS transistor having the channel of the second conductivity type, and having the gate electrode, as an electrode of the second conductivity type, and having a lamination structure in which an electrode layer containing an impurity of the first conductivity type introduced thereto, and an electrode layer containing an impurity of the second conductivity type introduced thereto are formed in this order; and other circuit element(s), other than a transistor, formed either below or above the vertical MOS transistor having the channel of the first conductivity type.

With the structure of the semiconductor device according to the embodiment of the present invention, each of the gate electrodes of the vertical MOS transistor having the channel of the first conductivity type, the planar MOS transistor having the channel of the first conductivity type, and the planar MOS transistor having the channel of the second conductivity type has the two-layer lamination structure. Also, the impurity of the first conductivity type is introduced to each of the lower electrode layers of the gate electrodes. For this reason, in the vertical MOS transistor having the channel of the first conductivity type, it is possible to increase a concentration of the impurity of the first conductivity type of a portion, of the gate electrode, buried in the semiconductor substrate. On the other hand, the impurity of the second conductivity type is introduced to the upper electrode layer of the gate electrode of the planar MOS transistor having the channel of the second conductivity type, and thus the gate electrode of the first conductivity type is made to turn into the gate electrode of the second conductivity type. Therefore, the resulting gate electrode of the planar MOS transistor having the channel of the second conductivity type can be used as the MOS transistor having the channel of the second conductivity type.

Also, the gate electrodes of the vertical MOS transistor having the channel of the first conductivity type, the planar MOS transistor having the channel of the first conductivity type, and the planar MOS transistor having the channel of the second conductivity type have the two-layer lamination structures having the same lower electrode layer. Thus, the gate electrodes of the vertical MOS transistor having the channel of the first conductivity type, the planar MOS transistor having the channel of the first conductivity type, and the planar MOS transistor having the channel of the second conductivity type can be formed at the same time by patterning the two electrode layers.

According to another embodiment of the present invention, there is provided a method of manufacturing a semiconductor device having a vertical MOS transistor having a channel of a first conductivity type and formed by burying a gate electrode in a semiconductor substrate, a planar MOS transistor having a channel of the first conductivity and having a gate electrode formed on the semiconductor substrate, and a planar MOS transistor having a channel of a second conductivity and having a gate electrode formed on the semiconductor substrate, the manufacturing method including the steps of:

forming an electrode layer obtained by forming a hole in the semiconductor substrate, filling an inside of the hole, and entirely introducing thereto an impurity of the first conductivity type;

forming an electrode layer containing no impurity introduced thereto on the electrode layer containing the impurity of the first conductivity type introduced thereto;

patterning a lamination structure of the two electrode layers into a pattern of the gate electrodes of the vertical MOS transistor having the channel of the first conductivity type, the planar MOS transistor having the channel of the first conductivity type, and the planar MOS transistor having the channel of the second conductivity type; and implanting ions of an impurity of the second conductivity type into the gate electrode of the planar MOS transistor having the channel of the second conductivity type.

With the method of manufacturing a semiconductor device according to the another embodiment of the present invention, the lamination structure of the two electrode layers is patterned into the pattern of the gate electrodes of the vertical MOS transistor having the channel of the first conductivity type, the planar MOS transistor having the channel of the first conductivity type, and the planar MOS transistor having the channel of the second conductivity type. As a result, the gate electrodes of the vertical MOS transistor having the channel of the first conductivity type, the planar MOS transistor having the channel of the first conductivity type, and the planar MOS transistor having the channel of the second conductivity type can be formed at the same time. As a result, the gate electrodes need not to be formed in twice as with the manufacturing method shown in FIGS. 5A to 5H. Also, the oxide film 109 shown in FIG. 5D also becomes unnecessary.

In addition, the ions of the impurity of the second conductivity type are implanted into the gate electrode of the planar MOS transistor having the channel of the second conductivity type. Therefore, the conductivity type of the gate electrode can be changed from the first conductivity type into the second conductivity type. As a result, the resulting gate electrode can be used as the gate electrode of the planar MOS transistor having the channel of the second conductivity type.

Also, the electrode layer is formed by forming the hole in the semiconductor substrate, filling the inside of the hole, and entirely introducing thereto the impurity of the first conductivity type. As a result, for formation of the gate electrode of the vertical MOS transistor having the channel of the first conductivity type, the inside of the hole can be filled with the electrode layer containing the impurity of the first conductivity type introduced thereto, and having a high concentration of the impurity of the first conductivity type.

Moreover, the electrode layer containing no impurity introduced thereto is formed on the electrode layer containing the impurity of the first conductivity type introduced thereto. Therefore, in each of the planar MOS transistor having the channel of the first conductivity type, and the planar MOS transistor having the channel of the second conductivity type, the concentration of the impurity of the first conductivity type in the gate electrode can be made relatively low. Also, in the planar MOS transistor having the channel of the second conductivity type, by carrying out the ion implantation of the impurity of the second conductivity type, the conductivity type of the gate electrode can be relatively, readily changed from the first conductivity to the second conductivity type.

According to still another embodiment of the present invention, there is provided a solid-state image pickup element having a photodiode formed every pixel in a semiconductor substrate, a vertical MOS transistor having a channel of a first conductivity type and formed by burying a gate electrode in a semiconductor substrate, a planar MOS transistor having a channel of the first conductivity and having a gate electrode formed on the semiconductor substrate, and a planar MOS transistor having a channel of a second conductivity and having a gate electrode formed on the semiconductor substrate, the solid-state image pickup element including:

the photodiode;

the vertical MOS transistor having the channel of the first conductivity type, including the gate electrode formed as a lamination structure in which an electrode layer containing an impurity of the first conductivity type introduced thereto, and an electrode layer containing no impurity introduced thereto are formed in this order, formed on the photodiode, and becoming a transfer gate;

the planar MOS transistor having the channel of the first conductivity type, and having the gate electrode having a lamination structure in which an electrode layer containing an impurity of the first conductivity type introduced thereto, and an electrode layer containing no impurity introduced thereto are formed in this order; and the planar MOS transistor having the channel of the second conductivity type, and having the gate electrode, as an electrode of the second conductivity type, having a lamination structure in which an electrode layer containing an impurity of the first conductivity type introduced thereto, and an electrode layer containing an impurity of the second conductivity type introduced thereto are formed in this order.

With the structure of the solid-state image pickup element according to the still another embodiment of the present invention, each of the gate electrodes of the vertical MOS transistor having the channel of the first conductivity type, the planar MOS transistor having the channel of the first conductivity type, and the planar MOS transistor having the channel of the second conductivity type has the two-layer lamination structure. Also, the impurity of the first conductivity type is introduced to each of the lower electrode layers of the gate electrodes. For this reason, in the vertical MOS transistor having the channel of the first conductivity type, it is possible to increase a concentration of the impurity of the first conductivity type of a portion, of the gate electrode, buried in the semiconductor substrate. On the other hand, the impurity of the second conductivity type is introduced to the upper electrode layer of the gate electrode of the planar MOS transistor having the channel of the second conductivity type, and thus the gate electrode of the first conductivity type is made to turn into the gate electrode of the second conductivity type. Therefore, the resulting gate electrode of the planar MOS transistor having the channel of the second conductivity type can be used as the MOS transistor having the channel of the second conductivity type.

Also, the gate electrodes of the vertical MOS transistor having the channel of the first conductivity type, the planar MOS transistor having the channel of the first conductivity type, and the planar MOS transistor having the channel of the second conductivity type have the two-layer lamination structures having the same lower electrode layer. Thus, the gate electrodes of the vertical MOS transistor having the channel of the first conductivity type, the planar MOS transistor having the channel of the first conductivity type, and the planar MOS transistor having the channel of the second conductivity type can be formed at the same time by patterning the two electrode layers.

As set forth hereinabove, according to the present invention, since the gate electrode of the vertical MOS transistor having the channel of the first conductivity type, the planar MOS transistor having the channel of the first conductivity type, and the planar MOS transistor having the channel of the second conductivity type can be formed at the same time by patterning the two electrode layers, it is possible to simplify the manufacture processes. As a result, it is possible to enhance the productivity.

In addition, since the number of times of the etching processes is reduced, the frequency of generation of the residue remaining after completion of the etching process, and the frequency of generation of the divot in the Shallow Trench Isolation (STI) can be both reduced, thereby increasing the manufacture yield.

Therefore, according to the present invention, the semiconductor device and the solid-state image pickup element each including the vertical MOS transistor can be manufactured with the high productivity and in the high yield.

Also, the use of the vertical MOS transistor results in that other circuit elements of the semiconductor device and the photodiode of the solid-state image pickup element, and the vertical MOS transistor can be formed one above the other, and thus the entire area can be reduced.

As a result, it is possible to realize the miniaturization of the semiconductor device, and the miniaturization and the promotion of the multiple pixels of the solid-state image pickup element.

In addition, in the solid-state image pickup element of an embodiment of the present invention, the area of the photodiode of each of the pixels can be increased, thereby enhancing the sensitivity.

Moreover, in the vertical MOS transistor having the channel of the first conductivity type, it is possible to increase the concentration of the impurity of the first conductivity type in the portion, of the gate electrode, buried in the inside of the hole. Also, in the planar MOS transistor having the channel of the first conductivity type, it is possible to reduce the concentration of the impurity of the first conductivity type in the gate electrode. As a result, the concentration of the impurity of the gate electrodes of the vertical MOS transistor having the channel of the first conductivity type, and the concentration of the impurity of the planar MOS transistor having the channel of the first conductivity type can be adjusted, thereby making it possible to realize the desired characteristics in the vertical MOS transistor having the channel of the first conductivity type, and the planar MOS transistor having the channel of the first conductivity type.

DETAILED DESCRIPTION OF THE PREFERRED EMBODIMENTS

The preferred embodiments of the present invention will be described in detail hereinafter with reference to the accompanying drawings.

Figure 1A:
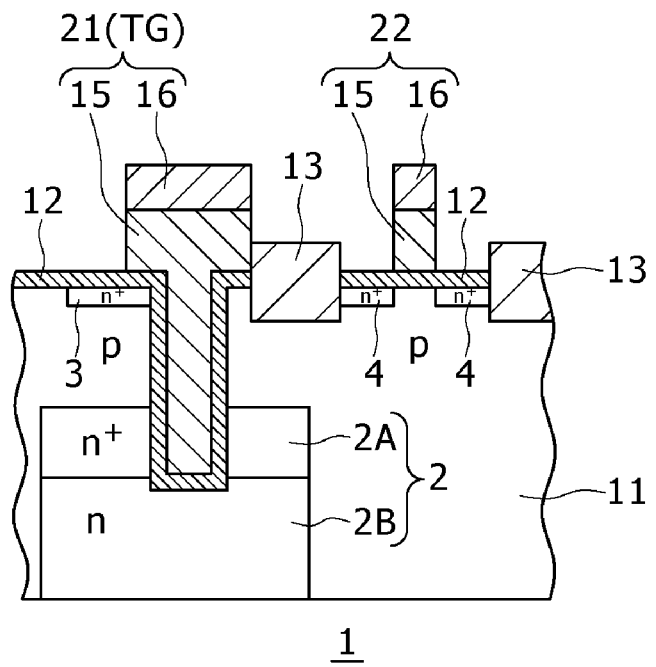
FIGS. 1A and 1B are respectively a schematic cross sectional view of a pixel portion of a solid-state image pickup element according to an embodiment of the present invention.
Figure 1B:
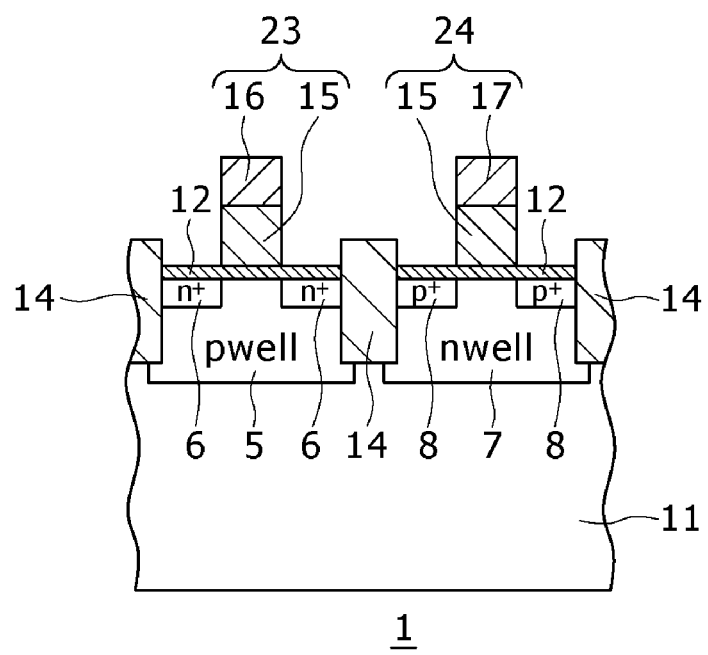

It is noted that the description will be given below in accordance with the following order.
1. Solid-State Image Pickup Element
2. Semiconductor Device
3. Changes
<1. Solid-State Image Pickup Element>
FIGS. 1A and 1B are respectively a schematic cross sectional view of a pixel portion of a solid-state image pickup element according to an embodiment of the present invention, and a schematic cross sectional view of a logic portion of the solid-state image pickup element according to the embodiment of the present invention. In this embodiment, the present invention is applied to a CMOS solid-state image pickup element (CMOS image sensor).

The CMOS solid-state image pickup element 1 includes a transfer transistor composed of a vertical NMOS transistor, and another transistor composed of a planar NMOS transistor in a pixel portion, and planar MOS transistors (an NMOS transistor and a PMOS transistor) in a logic portion.

The transfer transistor composed of the vertical NMOS transistor, and another transistor (a reset transistor, an amplification transistor, a selection transistor or the like) composed of the planar NMOS transistor are formed in the pixel portion shown in FIG. 1A.

An n-type impurity region 2 composing a photodiode of a light receiving portion is formed on a lower side (on a back surface side) of a semiconductor substrate 11 such as a silicon substrate and below the vertical NMOS transistor. The n-type impurity region 2 is composed of a lower n-type impurity region 2B having a low concentration of an n-type impurity, and an upper $n^+$-type impurity region 2A having a high concentration of an n-type impurity.

Also, an $n^+$-type impurity region 2A having a high concentration of an n-type impurity is formed in the vicinity of a surface of the semiconductor substrate 11 and above the n-type impurity region 2.

In the transfer transistor composed of the vertical NMOS transistor, a gate electrode 21 filled in a hole formed in the semiconductor substrate 11 becomes a transfer gate TG. A gate insulating film 12 is formed so as to cover an inner surface of the hole formed in the semiconductor substrate 11, and the gate electrode 21 is filled in the hole formed in the semiconductor substrate 11 through the gate insulating film 12. The $n^+$-type impurity region 2A composing the photodiode, and the $n^+$-type impurity region 3 formed in the vicinity of the surface of the semiconductor substrate 11 become source and drain regions, respectively. Also, a region between the $n^+$-type impurity region 2A and the $n^+$-type impurity region 3 as the source and drain regions, and in the vicinity of the gate insulating film 12 in the p-type semiconductor region of the semiconductor substrate 11 becomes a channel region.

The $n^+$-type impurity region 3 formed in the vicinity of the surface of the semiconductor substrate 11 is a region through which signal charges are read out from the photodiode composed of the n-type impurity region 2 by an operation of the transfer gate TG. Thus, the $n^+$-type impurity region 3 is used as a so-called floating diffusion (FD).

In the planar NMOS transistor, the $n^+$-type source and drain regions 4 each having a high impurity concentration are formed in a region which is separated from any of other elements such as the vertical NMOS transistor by an isolation layer 13 formed in the vicinity of the surface of the semiconductor substrate 11. Also, a gate electrode 22 is formed on the gate insulating film 12.

An NMOS transistor and a PMOS transistor composed of planar NMOS and PMOS transistors, respectively, are formed in the logic portion shown in FIG. 1B.

In the planar NMOS transistor in the logic portion of the CMOS solid-state image pickup element 1, a p-type well region 5 is formed in a region separated from any of other elements such as the planar PMOS transistor in the logic portion of the CMOS solid-state image pickup element 1 by a shallow trench isolation layer 14 composed of an insulating layer buried in the semiconductor substrate 11. $N^+$-type source and drain regions 6 each having a high impurity concentration are formed in the vicinity of the surface of the p-type well region 5, and a gate electrode 23 is formed on the gate insulating film 12.

In the planar PMOS transistor in the logic portion of the CMOS solid-state image pickup element 1, an n-type well region 7 is formed in a region separated from any of other element such as the planar NMOS transistor in the logic portion of the CMOS solid-state image pickup element 1 by the shallow trench isolation layer 14. P+-type source and drain regions 8 each having high a impurity concentration are formed in the vicinity of the surface of the p-type well region 7, and a gate electrode 24 is formed on the gate insulating film 12.

In the CMOS solid-state image pickup element 1 of the embodiment, in particular, each of the gate electrodes 21, 22, and 23, 24 of the vertical NMOS transistor, the planar NMOS transfer, and the planar NMOS transistor, the planar PMOS transistor has a two-layer structure. Specifically, each of the gate electrodes 21, 22, and 23, 24 is composed of an electrode layer 15 containing an n-type impurity (such as phosphorus) introduced thereto, and an electrode layer 16, 17 formed on the electrode layer 15.

In the vertical NMOS transistor and the planar NMOS transistor in the pixel portion, and the planar NMOS transistor in the logic portion, each of the upper electrode layers of the gate electrodes 21, 22 and 23 is the electrode layer 16 containing no impurity introduced thereto.

In the planar PMOS transistor in the logic portion, the upper electrode layer of the gate electrode 24 is the electrode layer 17 containing a p-type impurity (such as boron) introduced thereto.

Polycrystalline silicon, for example, can be used as a material of each of the electrode layers 15, 16 and 17. Also, the p-type impurity or the n-type impurity is either introduced or not introduced so as to correspond to the electrode layers 15, 16 and 17, respectively. With regard to formation of the polycrystalline silicon layer, firstly, an amorphous silicon layer may be deposited, and may be then crystallized by carrying out an annealing treatment, thereby obtaining the polycrystalline silicon layer.

Figure 2:
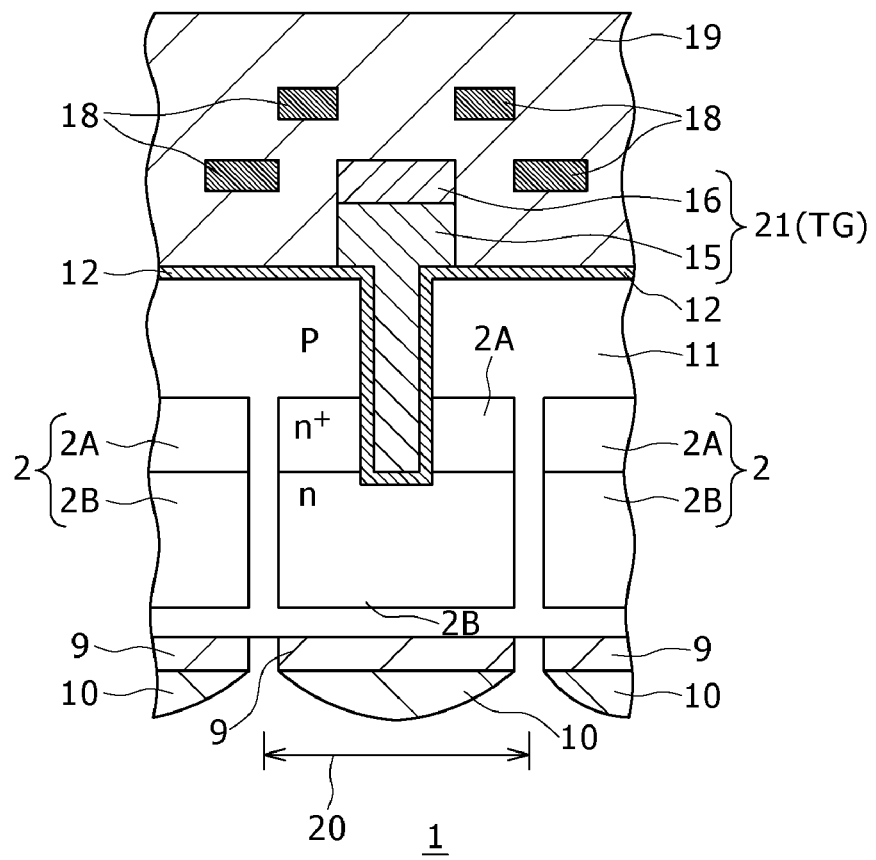
FIG. 2 is a cross sectional view showing a structure of an entire vertical MOS transistor in the pixel portion of the solid-state image pickup element according to the embodiment of the present invention.

It is noted that although FIGS. 1A and 1B show the cross sectional views of the vertical NMOS transistor and the planar NMOS transistor in the pixel portion, and the cross sectional views of the planar NMOS transistor and the planar PMOS transistor in the logic portion, respectively, a cross sectional view of the entire vertical NMOS transistor in the pixel portion is shown in FIG. 2. It should be noted that since FIG. 2 shows the cross sectional view different from that shown in FIG. 1A, the n+-type impurity region 3 used as the floating diffusion does not appear in FIG. 2.

As shown in FIG. 2, the n-type impurity region 2 composed of an n+-type impurity region 2A and an n-type impurity region 2B, and composing the photodiode becoming the light receiving portion is formed every pixel 20 in the lower portion of the semiconductor substrate 11.

Also, a color filter 9 and an on-chip lens 10 are formed in this order every pixel 20 on the back surface of the semiconductor substrate 11.

An insulating layer 19 is formed on the surface of the semiconductor substrate 11 so as to cover the gate insulating film 12, and the gate electrode 21. Wiring layers 18 are formed inside the insulating layer 19. It is noted that although not illustrated in FIG. 2, the wiring layers 18 and the insulating layer 19 are also formed above other transistors such as the planar NMOS transistor in the pixel portion shown in FIG. 1A, and above the transistors such as the planar NMOS transistor and the planar PMOS transistor in the logic portion shown in FIG. 1B.

Figure 3:
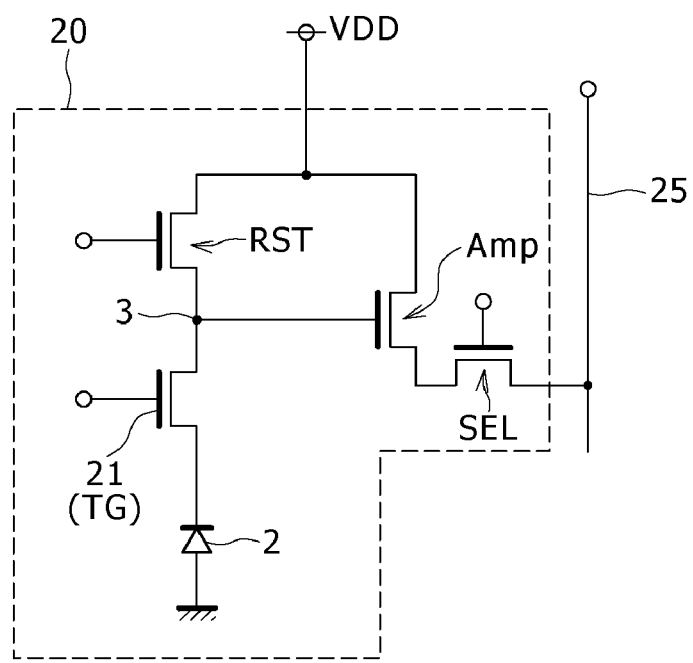
FIG. 3 is an equivalent circuit diagram of one pixel in the pixel portion of the solid-state image pickup element shown in FIGS. 1A and 1B.

Here, FIG. 3 shows an equivalent circuit diagram of one pixel 20 in the pixel portion of the CMOS solid-state image pickup element.

As shown in FIG. 3, the photodiode composed of the n-type impurity region 2 is connected to the n+-type impurity region 3 as the floating diffusion through the gate electrode 21 as the transfer gate TG. In addition, the floating diffusion 3 is connected to each of one of source and drain regions of a reset transistor RST, and a gate of an amplification transistor Amp. One of source and drain regions of a selection transistor SEL is connected to one of source and drain regions of the amplification transistor Amp. A power source potential VDD is supplied to each of the other of the source and drain regions of the reset transistor RST, and the other of the source and drain regions of the amplification transistor Amp. Also, a signal line 25 is connected to the other of the source and drain regions of the selection transistor SEL.

That is to say, the equivalent circuit diagram of each of the pixels is the same as that of each of the pixels in the existing configuration having the planar MOS transistor used as the transfer MOS transistor.

Subsequently, a method of manufacturing the CMOS solid-state image pickup element 1 of the embodiment will be described with reference to FIGS. 4A to 4E. It is noted that an illustration of a part of the constituent elements such as the p-type well region 5 and the n+-type impurity region 6 in the planar NMOS transistor, and the n-type well region 7 and the p+-type impurity region 8 in the planar PMOS transistor shown in FIG. 1B is omitted in FIGS. 4A to 4E.

Firstly, after the hole for the gate electrode of the vertical NMOS transistor is formed in the semiconductor substrate 11 by utilizing a dry etching method, for example, a thin silicon oxide film is formed as the gate insulating film 12. At this time, it is better that the silicon oxide film is formed as the gate insulating film 12 by adopting a vertical oxidation process which is low in dependency on surface orientation of silicon, and which is effective in rounding of a corner portion, and reduction of roughness in silicon. In the radical oxidation, for example, $H_2$ and $O_2$ are used as the raw material gas, and the treatment is carried out at a temperature of 800 to 1,100° C.

After that, a hole for the shallow trench isolation layer 14 is formed in the semiconductor substrate 11, and the hole, for example, is then filled with a silicon oxide layer, thereby forming the shallow trench isolation layer 14. In addition, a silicon oxide layer, for example, is formed as the isolation layer 13 of the pixel portion.

In addition, the electrode layer 15 containing the n-type impurity introduced thereto is formed over the entire surface of the semiconductor substrate 11. For example, the phosphorus-doped amorphous silicon (PDAS) layer is formed at a temperature of 500 to 600° C. by utilizing a chemical vapor deposition (CVD) method using a $SiH_4$ gas, a $H_2$ gas, and a $PH_3$ gas. A concentration of phosphorous in PDAS is preferably set in the range of 0.12 to 0.25 wt %.

It is noted that a thickness of the electrode layer 15 is set so as to correspond to a diameter of the hole for the gate electrode 21 of the vertical NMOS transistor, that is, set as being half or more the diameter of the hole for the gate electrode 21 of the vertical NMOS transistor. For example, when the diameter of the hole is 200 nm, the thickness of the electrode layer 15 is set at 100 nm or more. As a result, the inside of the hole is filled with only the electrode layer 15.

Figure 4A:
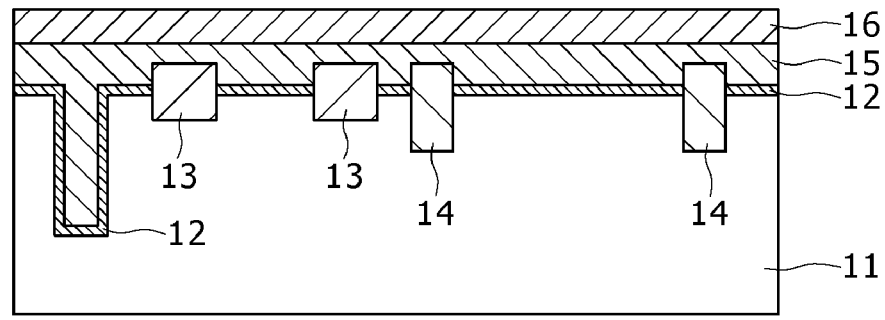
FIGS. 4A to 4E are respectively cross sectional views showing respective processes for manufacturing the solid-state image pickup element shown in FIGS. 1A and 1B.

In addition, the electrode layer 16 containing no impurity introduced thereto is formed on the electrode layer 15 (hereinabove refer to FIG. 4A). For example, an amorphous silicon layer is formed to have a thickness of 80 nm relative to a thickness of 100 nm of the electrode layer 15.

Figure 4B:
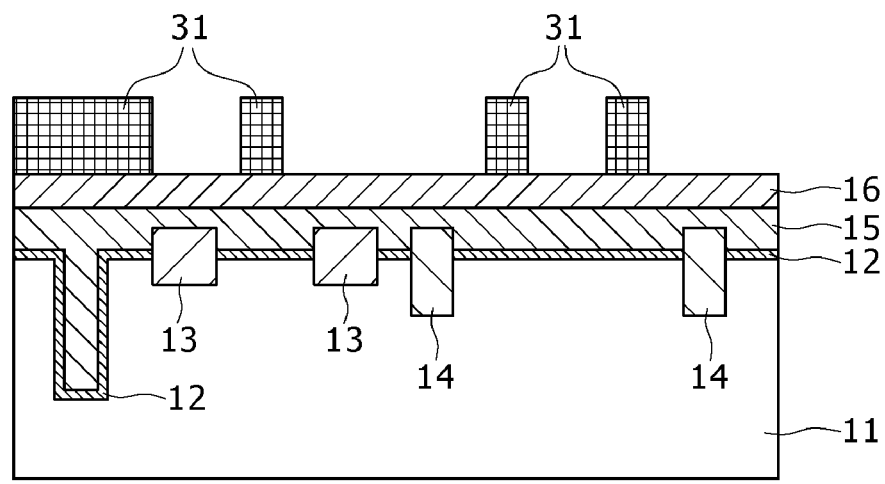

Next, as shown in FIG. 4B, a resist 31 having a pattern corresponding to the gate electrodes 21, 22, and 23, 24 of the vertical NMOS transistor and the planar NMOS transistor in the pixel region, and the planar NMOS transistor and the planar PMOS transistor in the logic portion is formed on the electrode layer 16.

Figure 4C:
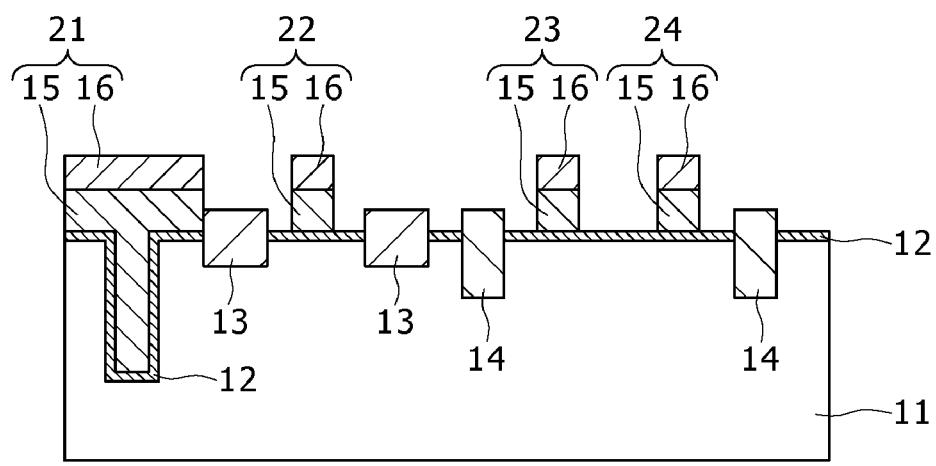

Next, as shown in FIG. 4C, the electrode layer 15 and the electrode layer 16 are both patterned with the resist 31 as a mask, and the resist 31 is then removed away. As a result, the gate electrodes 21, 22, and 23, 24 of the vertical NMOS transistor and the planar NMOS transistor in the pixel region, and the planar NMOS transistor and the planar PMOS transistor in the logic portion are formed.

Figure 4D:
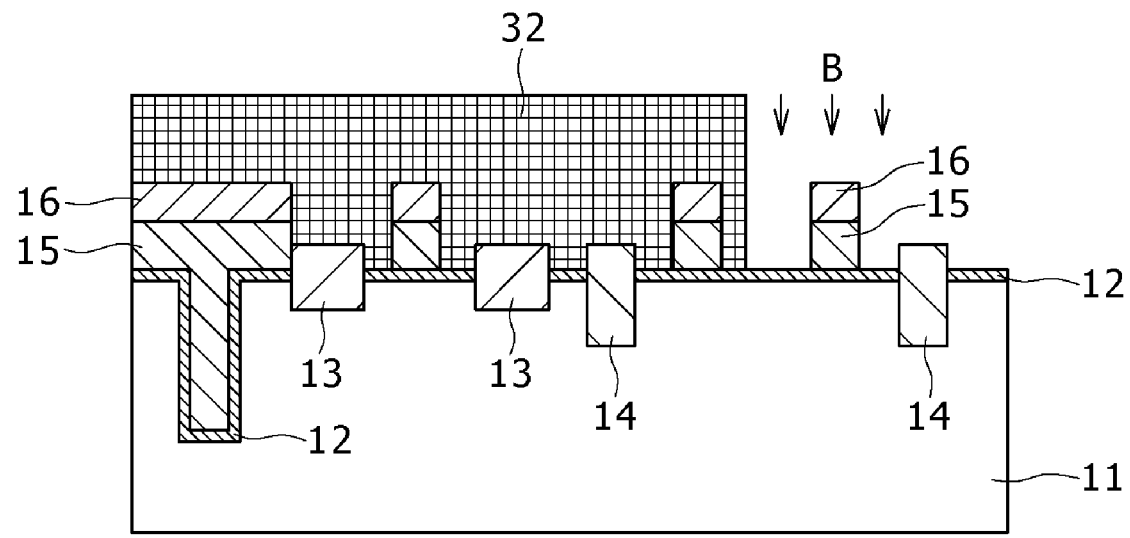

Next, as shown in FIG. 4D, a resist 32 is formed so as to cover the vertical NMOS transistor and the planar NMOS transistor in the pixel region, and the planar NMOS transistor in the logic portion except for the planar PMOS transistor in the logic portion. Also, as indicated by arrows in FIG. 4D, ions of boron as the p-type impurity are implanted into the planar PMOS transistor in the logic portion. A dosage, for example, is set at $7\times10^{15}$ atoms/cm$^2$.

Figure 4E:
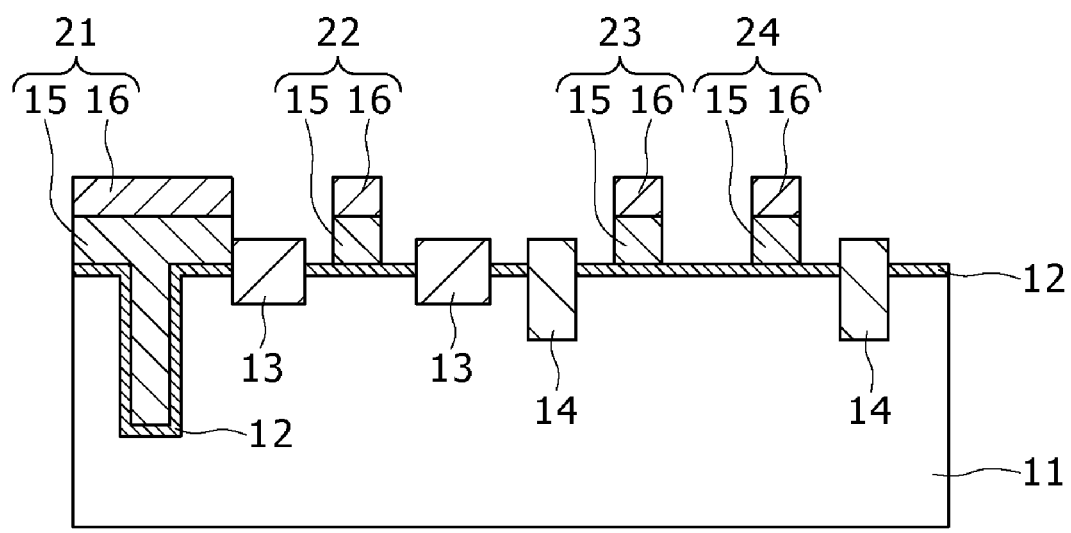
Figure 5A:
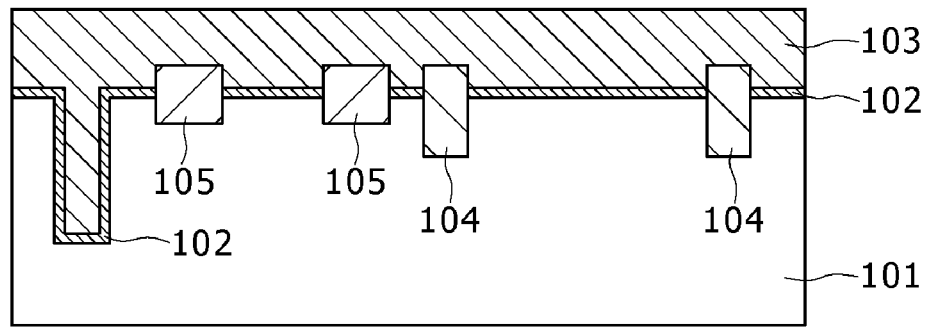
FIGS. 5A to 5H are respectively cross sectional views showing respective processes for manufacturing an existing solid-state image pickup element having a vertical MOS transistor.
Figure 5B:
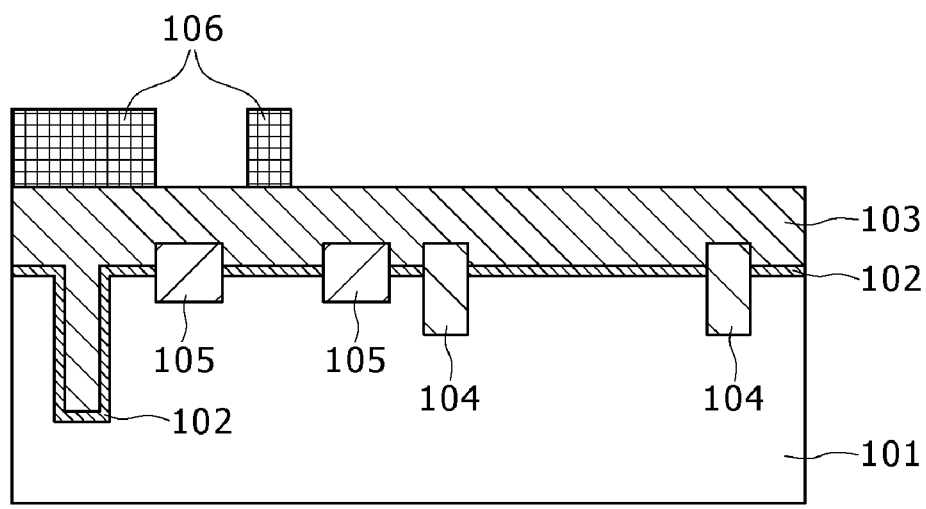
Figure 5C:
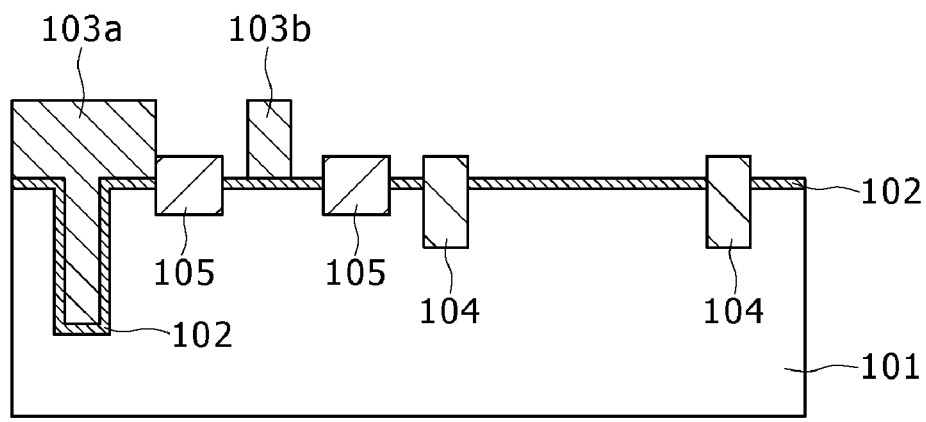
Figure 5D:
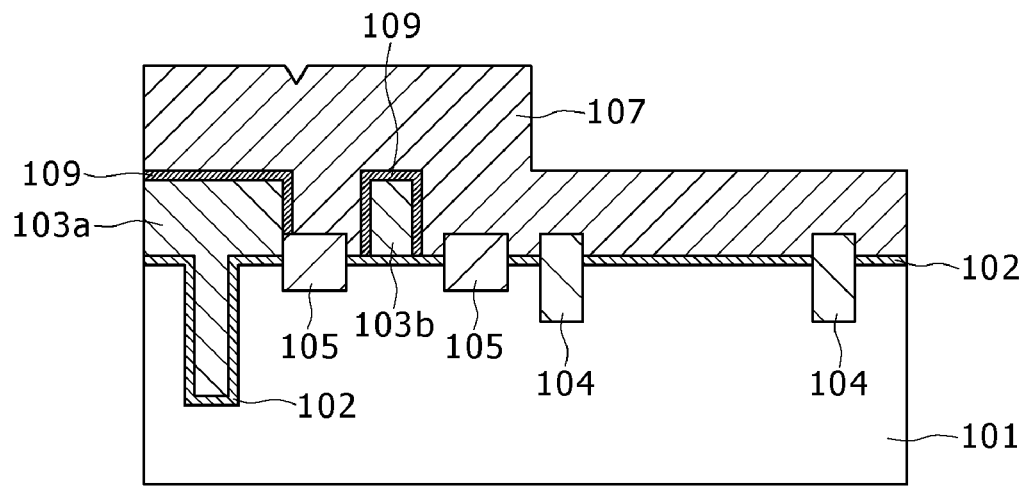
Figure 5E:
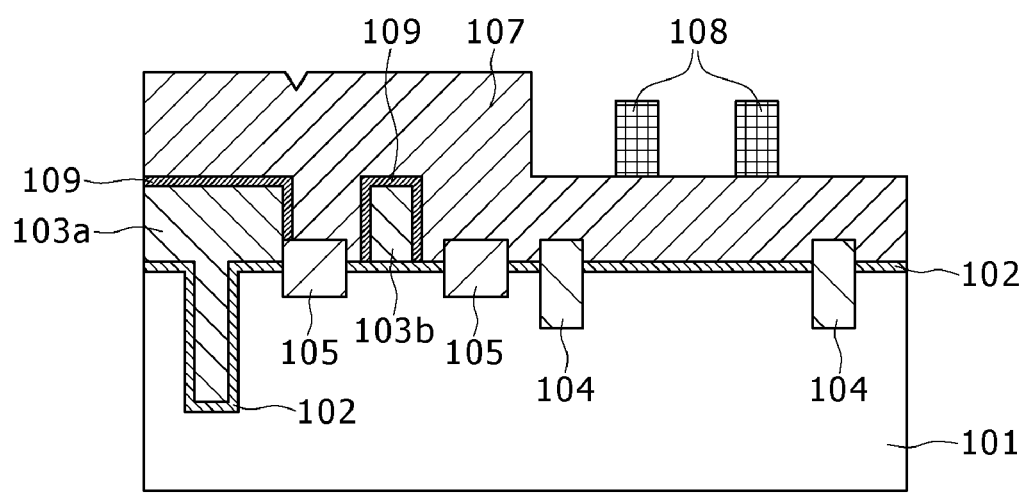
Figure 5F:
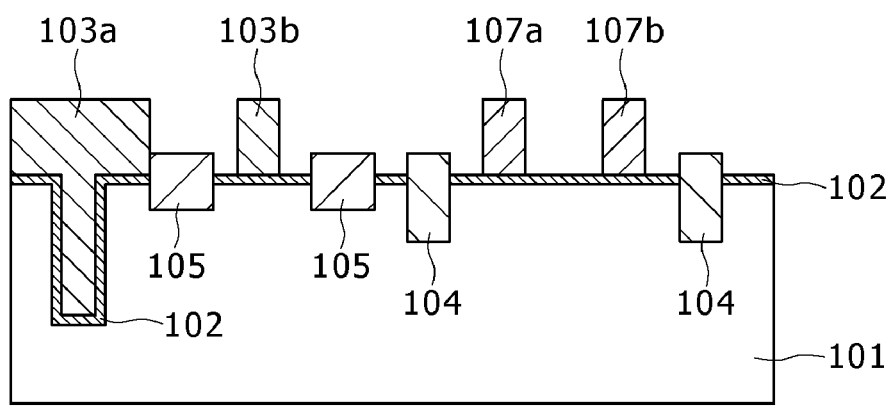
Figure 5G:
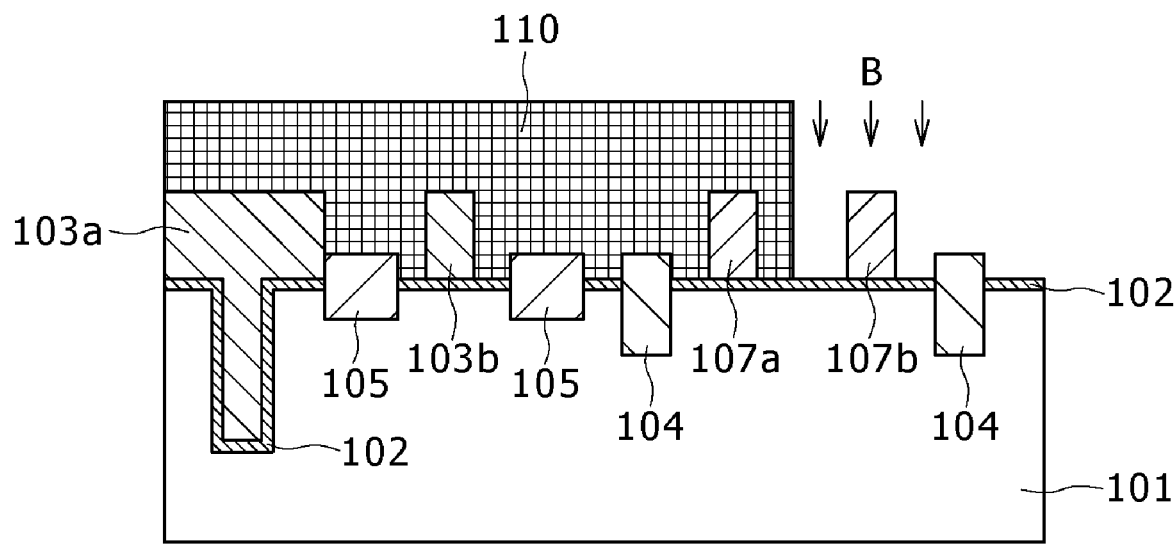
Figure 5H:
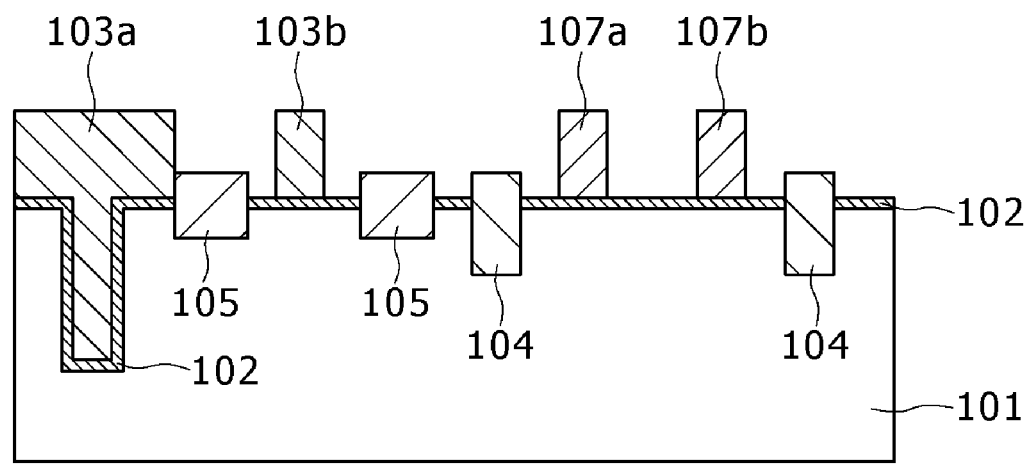

Subsequently, as shown in FIG. 4E, the resist 32 is removed away. By carrying out the ion implantation of the p-type impurity, the electrode layer 16 of the planar PMOS transistor in the logic portion is made to turn into the electrode layer 17 containing the p-type impurity introduced thereto. Note that, at this time, although the electrode layer 15 containing the n-type impurity introduced thereto of the planar PMOS transistor in the logic portion is made to turn into an electrode layer containing both the n-type impurity and the p-type impurity introduced thereto because the ions of the p-type impurity are implanted into the electrode layer 15 as well containing the n-type impurity introduced thereto, reference numeral of the resulting electrode layer is held as 15.

After that, by carrying out an annealing treatment (heat treatment), amorphous silicon forming each of the electrode layers 15, 16 and 17 is crystallized, thereby forming each of the electrode layers 15, 16 and 17 from a polycrystalline silicon layer. At this time, the ions of boron as the p-type impurity thus implanted diffuse through an interface between crystal grains to be accumulated in the vicinity of the interface with the gate insulating film 12 to be activated. The conductivity type of the entire gate electrode 24 of the planar PMOS transistor in the logic portion is changed from the n-type to the p-type in the manner described above. The boron ions accumulated in the vicinity of the interface with the gate insulating film 12 contribute to the p-type polarity of the gate electrode 24 of the planar PMOS transistor in the logic portion.

It is noted that since the n-type impurity contained in the electrode layer 15 diffuses into the non-doped electrode layer 16 by carrying out the annealing treatment, a boundary between the final n-type layer and the non-doped layer is slightly changed from that in a phase of the deposition.

After that, the insulating layer 19 is formed so as to cover the gate electrodes 21, 22, and 23, 24, and the wiring layer 18 and the insulating layer 19 are then repetitively formed.

The CMOS solid-state image pickup element 1 of the embodiment can be manufactured in the manner described above.

Here, let us consider the case where each of the gate electrodes 21, 22, and 23, 24 is structured in the form of a lamination structure of the PDAS containing therein 0.25 wt % of phosphorus, and amorphous silicon. Since the PDAS is filled in the vertical NMOS transistor, a concentration of phosphorus in the vicinity of the interface with the gate insulating film 12 is 0.25 wt %.

On the other hand, in the lamination portion of PDAS and amorphous silicon in the gate electrode of the planar NMOS transistor, the concentration of phosphorus is reduced from the original concentration, i.e., 0.25 wt % to 0.14 to 0.15 wt % due to the diffusion of phosphorus toward amorphous silicon by the annealing treatment in the subsequent process.

That is to say, the concentration of phosphorus in a portion, of the gate electrode 21, in the vicinity of the interface with the gate insulating film 12 of the vertical NMOS transistor becomes higher than that of phosphorus in a portion, of the gate electrode 22, 23, in the vicinity of the interface with the gate insulating film 12 of the planar NMOS transistor.

Therefore, in the planar NMOS transistors and the planar PMOS transistor, the gate electrodes 22, 23 and 24 can be formed so as to have the desired phosphorus concentrations, respectively, in accordance with the control for the thickness of the electrode layers 15 and 16 in the lamination structure, and the control for the phosphorus concentration of the PDAS (the electrode layer 15).

In addition, the diffusion of phosphorus is promoted and the phosphorus concentration in the vicinity of the interface is increased as the crystal gain is smaller and the number of grain boundaries is larger.

The size of the crystal grain depends on the phosphorus concentration of the PDAS. Therefore, when the phosphorus concentration is reduced, the crystal grain becomes smaller, and thus the satisfactory p-type characteristics can be obtained in the gate electrode 24 into which boron ions are implanted.

In addition, it also becomes the means for obtaining the satisfactory p-type characteristics that the acceleration voltage during the ion implantation of boron is increased, and thus the profile of boron is controlled so as to be situated near the interface with the gate insulating film 12.

For example, all it takes is that the acceleration voltage is set at about 15 to about 22 keV. As a result, the profile of boron can be controlled so as to be situated near the interface with the gate insulating film 12 while the penetration of boron toward the semiconductor substrate 11 through the gate insulating film 12 is suppressed.

It is noted that in the planar PMOS transistor in the logic portion, the concentration of boron, in the gate electrode 24, in the vicinity of the interface between the gate electrode 24 and the gate insulating film 12 is preferably equal to or larger than $2\times10^{20}$ atoms/cm$^2$. That concentration of boron is set at being equal to or larger than $2\times10^{20}$ atoms/cm$^2$, which results in that the satisfactory characteristics are obtained in terms of the p-type electrode.

In addition, the distribution of phosphorus in the gate electrode 24 of the planar PMOS transistor in the logic portion preferably has such a profile that the concentration of phosphorus monotonously decreases from a specific depth of the gate electrode toward the surface.

According to the structure of the CMOS solid-state image pickup element 1 of the embodiment, since the vertical NMOS transistor is formed on the photodiode composed of the n-type impurity region 2, the area of the pixel portion can be reduced. As a result, either the miniaturization or the promotion of the multiple pixels of the CMOS solid-state image pickup element 1 becomes possible.

In addition, since the area of the photodiode can be increased, it is possible to enhance the sensitivity of the CMOS solid-state image pickup element 1.

Therefore, in an apparatus such as a camera including the CMOS solid-state image pickup element 1, either the miniaturization or the promotion of the multiple pixels in the apparatus. Or, an image can be obtained even at a low illuminance by enhancing the sensitivity.

According to the embodiment of the present invention, the gate electrodes 21, 22, and 23, 24 of the vertical NMOS transistor and the planar NMOS transistor in the pixel portion, and the planar NMOS transistor and the planar PMOS transistor in the logic portion can be formed at the same time by patterning the two electrode layers 15 and 16. Therefore, it is possible to simplify the manufacture processes. As a result, it is possible to enhance the productivity. In addition, since the number of times of the etching processes is reduced, it is possible to reduce the frequency of generation of the residue remaining after completion of the etching processing, and the frequency of generation of the divot in the shallow trench isolation layer 14. As a result, it is possible to enhance the manufacture yield.

That is to say, the CMOS solid-state image pickup element 1 including the vertical NMOS transistor can be manufactured with the satisfactory productivity and in the satisfactory yield.

In addition, each of the gate electrodes 21, 22, and 23, 24 is structured in the form of the lamination structure in which the electrode layer 15 containing phosphorus introduced thereto, and the electrode layer 16 or 17 containing no phosphorus introduced thereto are formed in this order. As a result, in the vertical NMOS transistor, it is possible to increase the concentration of phosphorus in the portion, of the gate electrode, buried in the hole of the semiconductor substrate 11. Also, in each of the planar NMOS transistors, and the planar PMOS transistor, it is possible to reduce the concentration of phosphorus in each of the gate electrodes 22, 23, and 24.

In the vertical NMOS transistor, the concentration of phosphorus in the gate electrode 22 is preferably high. On the other hand, in each of the planar NMOS transistors and the PMOS transistor, the concentration of phosphorus in each of the gate electrodes 22, 23, and 24 is preferably low. According to the embodiment, it is possible to readily realize the contradictory characteristics. That is to say, the desired characteristics can be realized in the vertical NMOS transistor, the planar NMOS transistor, and the planar NMOS transistor, the planar PMOS transistor, respectively by adjusting the impurity concentrations of the gate electrodes 21, 22, and 23, 24 of the vertical NMOS transistor, the planar NMOS transistor, and the planar NMOS transistor, the planar PMOS transistor.

In addition, since the concentration of phosphorus of the gate electrode 24 is low in the planar PMOS transistor, the conductivity type of the gate electrode 24 can be changed from the n-type to the p-type by carrying out the ion implantation of boron.

<2. Semiconductor Device>

In the embodiment described above, the present invention is applied to the CMOS solid-state image pickup element. However, the embodiment of the present invention can also be similarly applied to a semiconductor device having transistors and other circuit element(s). In this case, a semiconductor device according to another embodiment of the present invention has substantially the same structure as that of the CMOS solid-state image pickup element 1 according to the embodiment of the present invention shown in FIGS. 1A and 1B except for the photodiode composed of the n-type impurity region 2. That is to say, the semiconductor device according to the another embodiment of the present invention has a vertical NMOS transistor formed by burying a gate electrode in a semiconductor substrate, a planar NMOS transistor having a gate electrode formed on the semiconductor substrate, and a planar PMOS transistor having a gate electrode formed on the semiconductor substrate. In particular, the semiconductor device includes: the vertical NMOS transistor having the gate electrode having a lamination structure in which an n-type electrode layer and a non-doped electrode layer are formed in this order; the planar NMOS transistor having the gate electrode having a lamination structure in which an n-type electrode layer and a non-doped electrode layer are formed in this order; the planar PMOS transistor having the gate electrode, as a p-type electrode having a lamination structure in which an n-type electrode layer and a non-doped electrode layer are formed in this order; and other circuit element(s), other than a transistor, formed either below or above the vertical NMOS transistor.

A resistor, a capacitor, a memory element, a photodiode and the like can be given as other circuit elements. Unlike the solid-state image pickup element having a photodiode every pixel, a semiconductor device including a light receiving element composed of a single photodiode, for example, an infrared sensor or a device for receiving and detecting a laser beam is given as the semiconductor device having the photodiode.

In addition, other circuit element(s) may also be formed above the gate electrode of the vertical NMOS transistor instead of being formed below the vertical NMOS transistor.

In addition, a method of manufacturing the semiconductor device according to the another embodiment of the present invention includes substantially the same steps as those shown in FIGS. 4A to 4E. That is to say, the method of manufacturing the semiconductor device according to the another embodiment of the present invention includes the steps of: forming an electrode layer obtained by forming a hole in the semiconductor substrate, filling an inside of the hole, and entirely introducing thereto an impurity of an n-type; forming a non-doped electrode layer on the n-type electrode layer; patterning the lamination structure of the two electrode layers into the pattern of the gate electrodes of the vertical NMOS transistor, the planar NMOS transistor, and the planar PMOS transistor; and implanting ions of an impurity of the p-type into the gate electrode of the planar PMOS transistor.

Here, the semiconductor device has the vertical NMOS transistor formed by burying the gate electrode in the semiconductor substrate, the planar NMOS transistor having the gate electrode formed on the semiconductor substrate, and the planar PMOS transistor having the gate electrode formed on the semiconductor substrate.

<3. Changes>

In the embodiment described above, phosphorus (P) and boron (B) are introduced as the n-type impurity and the p-type impurity, respectively.

However, the present invention is by no means limited to the combination of these impurity elements, and thus another element may also be used either as the n-type impurity or the p-type impurity.

In the embodiment described above, with regard to the formation of the electrode layers 15 and 16, the amorphous silicon layer is firstly formed, and is then crystallized by carrying out the annealing treatment, thereby obtaining the polycrystalline silicon layer.

However, the present invention is by no means limited to such a forming method and a structure.

For example, the amorphous silicon layer may be formed as each of the electrode layers 15 and 16, thereby forming the gate electrode without being subsequently crystallized. In this case, the gate electrode is finally formed from the amorphous silicon layer.

In addition, for example, each of the electrode layers 15 and 16 may also be formed from the polycrystalline silicon layer, thereby subsequently forming the gate electrode. In this case, the gate electrode is finally formed from the polycrystalline silicon layer. Even for formation of the polycrystalline silicon layer, the polycrystalline silicon layer can be formed by utilizing the CVD method using a $SiH_4$ gas, a $H_2$ gas, and a $PH_3$ gas similarly to the case of formation of the amorphous silicon layer. However, the conditions (such as the temperature) of the CVD method are slightly different from those when the amorphous silicon layer is formed.

Although in the embodiment described above, the semiconductor substrate 11 has been described as the silicon substrate, the present invention is by no means limited thereto, and thus any other suitable silicon layer such as a silicon eptaxial layer on a silicon substrate, or a silicon layer formed on any other suitable substrate may also be used as the semiconductor substrate 11.

In addition, the semiconductor substrate may be made of a semiconductor other than silicon.

In addition, in the embodiment described above, the vertical MOS transistor is structured in the form of the vertical NMOS transistor. On the other hand, the present invention can be similarly applied to the case as well where in either the solid-state image pickup element or the semiconductor device, the vertical MOS transistor is structured in the form of a vertical PMOS transistor as long as the conductivity types of the individual layers and regions in the vertical PMOS transistor are obtained by reversing the conductivity types of the individual layers and regions in the vertical NMOS transistor in each of the embodiments described above.

That is to say, in the embodiments of the present invention, when the vertical MOS transistor is structured in the form of the vertical MOS transistor having the channel of the first conductivity type, in order that the gate electrode of the vertical MOS transistor may be of the first conductivity type, the electrode layer containing no impurity introduced thereto is formed on the electrode layer containing the impurity of the first conductivity type introduced thereto. On the other hand, with regard to the planar MOS transistor having the channel of the second conductivity type, the ions of the impurity of the second conductivity type are implanted into the lamination structure of the two electrode layers, thereby causing the gate electrode to be of the second conductivity type.

The present invention is by no means limited to the embodiments described above, and thus other various kinds of structures may also be adopted without departing from the subject matter of the present invention.

The present application contains subject matter related to that disclosed in Japanese Priority Patent Application JP 2009-134424 filed in the Japan Patent Office on Jun. 3, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device having a vertical MOS transistor having a channel of a first conductivity type and formed by burying a gate electrode in a semiconductor substrate, a planar MOS transistor having a channel of the first conductivity and having a gate electrode formed on said semiconductor substrate, and a planar MOS transistor having a channel of a second conductivity and having a gate electrode formed on said semiconductor substrate, said semiconductor device, comprising:
    said vertical MOS transistor having said channel of the first conductivity type, and having said gate electrode having a lamination structure in which an electrode layer containing an impurity of the first conductivity type introduced thereto, and an electrode layer containing no impurity introduced thereto are formed in this order;
    said planar MOS transistor having said channel of the first conductivity type, and having said gate electrode having a lamination structure in which an electrode layer containing an impurity of the first conductivity type introduced thereto, and an electrode layer containing no impurity introduced thereto are formed in this order;
    said planar MOS transistor having said channel of the second conductivity type, and having said gate electrode, as an electrode of the second conductivity type, and having a lamination structure in which an electrode layer containing an impurity of the first conductivity type introduced thereto, and an electrode layer containing an impurity of the second conductivity type introduced thereto are formed in this order; and
    other circuit element(s), other than a transistor, formed either below or above said vertical MOS transistor having said channel of the first conductivity type.

2. The semiconductor device according to claim 1, wherein the first conductivity type is an n-type, and the second conductivity type is a p-type.

3. The semiconductor device according to claim 1 wherein the impurity of the first conductivity type is phosphorus, and the impurity of the second conductivity type is boron.

4. The semiconductor device according to claim 3, wherein a concentration of phosphorus in said gate electrode of said vertical MOS transistor having the channel of the first conductivity type in a vicinity of an interface with a gate insulating film is set in a range of 0.15 to 0.25 wt %.

5. The semiconductor device according to claim 1, wherein a concentration of the impurity of the first conductivity type in said gate electrode of said vertical MOS transistor having said channel of the first conductivity type in a vicinity of an interface with a gate insulating film is higher than that of the impurity of the first conductivity type in said gate electrode of said planar MOS transistor having said channel of the first conductivity type in a vicinity of an interface with said gate insulating film.

6. A method of manufacturing a semiconductor device having a vertical MOS transistor having a channel of a first conductivity type and formed by burying a gate electrode in a semiconductor substrate, a planar MOS transistor having a channel of the first conductivity and having a gate electrode formed on said semiconductor substrate, and a planar MOS transistor having a channel of a second conductivity and having a gate electrode formed on said semiconductor substrate, said manufacturing method comprising the steps of:
    forming an electrode layer obtained by forming a hole in said semiconductor substrate, filling an inside of said hole, and entirely introducing thereto an impurity of the first conductivity type;
    forming an electrode layer containing no impurity introduced thereto on the electrode layer containing the impurity of the first conductivity type introduced thereto;
    patterning a lamination structure of said two electrode layers into a pattern of the gate electrodes of the vertical MOS transistor having said channel of the first conductivity type, said planar MOS transistor having said channel of the first conductivity type, and said planar MOS transistor having said channel of the second conductivity type; and
    implanting ions of an impurity of the second conductivity type into said gate electrode of said planar MOS transistor having said channel of the second conductivity type.

7. The method of manufacturing a semiconductor device according to claim 6, wherein the first conductivity type is an n-type, and the second conductivity type is a p-type.

8. The method of manufacturing a semiconductor device according to claim 6, wherein the impurity of the first conductivity type is phosphorus, and the impurity of the second conductivity type is boron.

9. The method of manufacturing a semiconductor device according to claim 6, wherein a thickness of said electrode layer containing the impurity of the first conductivity type introduced thereto is set as being equal to or larger than a diameter of said hole formed in said semiconductor substrate.

10. The method of manufacturing a semiconductor device according to claim 8, wherein said electrode containing phosphorus introduced thereto is formed as an amorphous silicon layer by utilizing a CVD method using a $SiH_4$ gas, a $H_2$ gas and a $PH_3$ gas.

11. The method of manufacturing a semiconductor device according to claim 8, wherein said electrode containing phosphorus introduced thereto is formed as a polycrystalline silicon layer by utilizing a CVD method using a $SiH_4$ gas, a $H_2$ gas and a $PH_3$ gas.

12. A solid-state image pickup element having a photodiode formed every pixel in a semiconductor substrate, a vertical MOS transistor having a channel of a first conductivity type and formed by burying a gate electrode in a semiconductor substrate, a planar MOS transistor having a channel of the first conductivity and having a gate electrode formed on said semiconductor substrate, and a planar MOS transistor having a channel of a second conductivity and having a gate electrode formed on said semiconductor substrate, said solid-state image pickup element comprising:
 said photodiode;
 said vertical MOS transistor having said channel of the first conductivity type, including said gate electrode formed as a lamination structure in which an electrode layer containing an impurity of the first conductivity type introduced thereto, and an electrode layer containing no impurity introduced thereto are formed in this order, formed on said photodiode, and becoming a transfer gate;
 said planar MOS transistor having said channel of the first conductivity type, and having said gate electrode having a lamination structure in which an electrode layer containing an impurity of the first conductivity type introduced thereto, and an electrode layer containing no impurity introduced thereto are formed in this order; and
 said planar MOS transistor having said channel of the second conductivity type, and having said gate electrode, as an electrode of the second conductivity type, having a lamination structure in which an electrode layer containing an impurity of the first conductivity type introduced thereto, and an electrode layer containing an impurity of the second conductivity type introduced thereto are formed in this order.

13. The solid-state image pickup element according to claim 12, further comprising:
 a pixel portion having a photodiode, said vertical MOS transistor having said channel of the first conductivity type, and said planar MOS transistor having said channel of the first conductivity type; and
 a logic portion having said planar MOS transistor having said channel of the first conductivity type, and said planar MOS transistor having said channel of the second conductivity type.

14. The solid-state image pickup element according to claim 12, wherein the first conductivity type is an n-type, and the second conductivity type is a p-type.

15. The solid-state image pickup element according to claim 12, wherein the impurity of the first conductivity type is phosphorus, and the impurity of the second conductivity type is boron.

* * * * *